(12) United States Patent
Wang

(10) Patent No.: US 9,697,890 B1
(45) Date of Patent: Jul. 4, 2017

(54) MEMORY AND INTERFACE CIRCUIT FOR BIT LINE OF MEMORY

(71) Applicant: Taiwan Semiconductor Manufacturing Co., Ltd., Hsinchu (TW)

(72) Inventor: Bing Wang, Palo Alto, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/170,092

(22) Filed: Jun. 1, 2016

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC .................................................. G11C 11/419
USPC .......................................................... 365/154
See application file for complete search history.

(56) References Cited

U.S. PATENT DOCUMENTS

| | | | | |
|---|---|---|---|---|
| 7,075,855 | B1 * | 7/2006 | Bunce | G11C 7/12 365/189.04 |
| 7,940,599 | B2 * | 5/2011 | Lu | G11C 8/10 365/189.04 |
| 8,325,512 | B2 * | 12/2012 | Chuang | G11C 11/413 365/154 |
| 8,605,523 | B2 | 12/2013 | Tao et al. | |
| 8,630,132 | B2 | 1/2014 | Cheng et al. | |
| 8,760,948 | B2 | 6/2014 | Tao et al. | |
| 8,908,421 | B2 | 12/2014 | Liaw | |
| 8,929,160 | B2 | 1/2015 | Katoch et al. | |
| 8,958,237 | B1 * | 2/2015 | Yang | G11C 11/419 365/154 |
| 8,964,492 | B2 | 2/2015 | Hsu et al. | |
| 8,982,643 | B2 | 3/2015 | Lum | |
| 9,117,510 | B2 | 8/2015 | Yang et al. | |
| 9,208,858 | B1 | 12/2015 | Lin et al. | |
| 9,218,872 | B1 | 12/2015 | Liaw | |
| 2010/0039876 | A1 * | 2/2010 | Adams | G11C 29/50 365/201 |
| 2013/0010544 | A1 | 1/2013 | Lin et al. | |
| 2014/0153345 | A1 | 6/2014 | Kim et al. | |
| 2014/0233330 | A1 | 8/2014 | Ko et al. | |
| 2014/0269091 | A1 * | 9/2014 | Zheng | G11C 16/28 365/185.21 |
| 2015/0348598 | A1 | 12/2015 | Wang et al. | |
| 2015/0371702 | A1 | 12/2015 | Wu et al. | |
| 2015/0380077 | A1 | 12/2015 | Wu et al. | |

(Continued)

*Primary Examiner* — Thao H Bui
(74) *Attorney, Agent, or Firm* — McClure, Qualey & Rodack, LLP

(57) ABSTRACT

An interface circuit is provided. A NMOS transistor is coupled between a first bit line and a ground. A logic gate is coupled between a gate of the NMOS transistor and a second bit line. A keeper controls a voltage level of the second bit line according to a reference voltage. A tracking circuit includes a plurality of reference bit cells and a pull-up device coupled to a reference bit line. Each reference bit cell is coupled to a read word line. When a bit cell coupled to the second bit line is accessed by a specific read word line, the reference bit cell coupled to the specific read word line drains a current from the pull-up device. The tracking circuit provides the reference voltage according to the current.

20 Claims, 4 Drawing Sheets

(56) References Cited

U.S. PATENT DOCUMENTS

2015/0380078 A1 12/2015 Liaw
2016/0111143 A1 4/2016 Lin

* cited by examiner

MEMORY AND INTERFACE CIRCUIT FOR BIT LINE OF MEMORY

BACKGROUND

Static random access memories (SRAM) are commonly used in integrated circuits. Furthermore, SRAM are used for electronic applications where high speed, low power consumption and simple operation are needed. Embedded SRAM is particularly popular in high speed communication, image processing and system-on-chip (SOC) applications. SRAM has the advantageous feature of holding data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time. In contrast, a multi-port SRAMs enables multiple reads or writes to occur at approximately the same time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
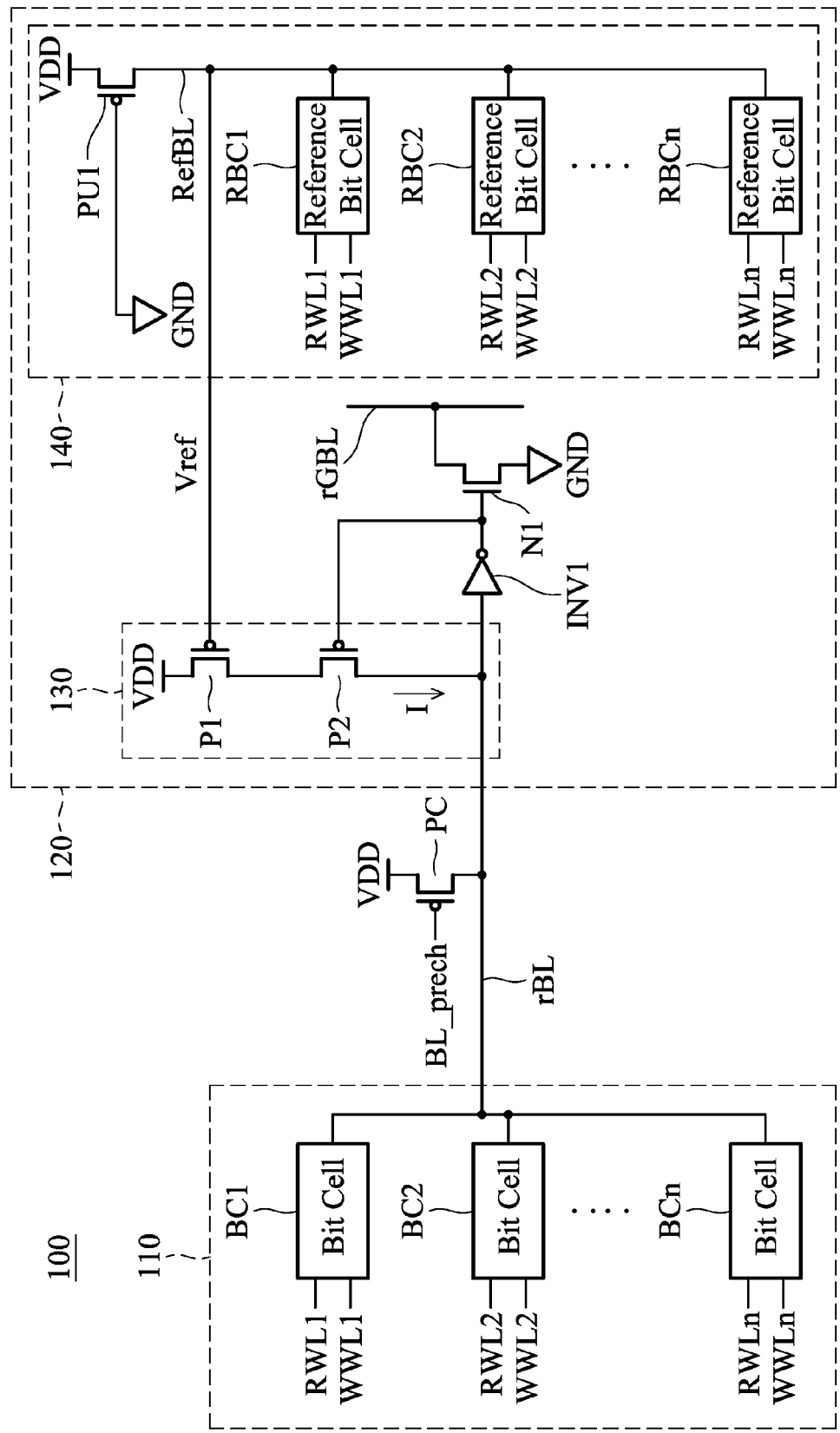
FIG. 1 shows a memory, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a memory 100, in accordance with some embodiments of the disclosure. The memory 100 includes a memory bank 110, an interface circuit 120, and a pre-charge transistor PC. The memory 100 can be an independent device or be implemented in an integrated circuit (e.g. System on Chip (SOC)).

In some embodiments, the memory 100 can be a random access memory (RAM). In some embodiments, the memory 100 is a single-port static random access memory (SRAM). In some embodiments, the memory 100 is a multi-port SRAM, such as a 2 ports (2P) SRAM.

In a SRAM, a cycle for accessing data stored in bit cells of the SRAM has a pre-charge period. In the pre-charge period, a bit line coupled to the bit cells to be accessed will be pre-charged to a voltage level, such as a high voltage level or a high logic level (e.g. "1"). The data of the bit line are then sensed by a sensing circuit so as to output the data. In general, the voltage level of the bit line will undesirably transition because leakage currents flowing through transistors of the bit cell coupled with the bit line and will pull down voltage level of the bit line. Furthermore, the leakage currents may become worse if the operation of the memory circuit is at the worst corner of Process-Voltage-Temperature (PVT) variations. To avoid the undesired transitions of the bit line, a keeper coupled to the bit line is used to maintain a voltage level of the bit line.

The memory bank 110 includes a plurality of bit cells BC1 through BCn, and the bit cells BC1 through BCn are disposed in a memory array. In the memory bank 110, each bit cell is coupled to the write bit line (not shown) and the read bit line rBL. Furthermore, each bit cell is capable of storing one-bit data, and each bit cell can be accessed by a read word line RWL for reading and a write word line WWL for writing/programming. For example, the bit cell BC1 can be accessed by a read word line RWL1 and/or a write word line WWL1. When the bit cell BC1 is selected (or addressed) by the read word line RWL1, the data stored in the bit cell BC1 is provided to the read bit line rBL. Furthermore, the bit cell BCn can be accessed by a read word line RWLn and/or a write word line WWLn. When the bit cell BCn is selected (or addressed) by the read word line RWLn, data stored in the bit cell BCn is provided to the read bit line rBL. Specifically, each of the bit cells BC1 through BCn has the individual read word line and the individual write word line. Furthermore, one bit cell is read at a time for the read bit line rBL. In some embodiments, the read word line RWL and the write word line WWL coupled to the same bit cell can be integrated into a single word line WL for a single-port SRAM. In some embodiments, the amount of bit cells BC1-BCn is 32 or 64.

Before a bit cell is accessed for reading, the corresponding read bit line rBL is pre-charged to a high voltage level or a high logic level (e.g. "1"). The term "pre-charged" is used to indicate that the read bit line rBL is charged prior to reading. The pre-charge transistor PC is coupled between a power source VDD and the read bit line rBL. A gate of the pre-charge transistor PC is capable of receiving a pre-charge enable signal BL_prech to turn on the pre-charge transistor PC, so as to connect the power source VDD to the read bit line rBL during a pre-charge period. It should be noted that the number, type, and disposition of the pre-charge transistor PC are merely exemplary.

The interface circuit 120 includes a keeper 130, a tracking circuit 140, an inverter INV1, and an NMOS transistor N1. The NMOS transistor N1 is coupled between a global read bit line rGBL and a ground GND. The inverter INV1 is coupled between the read bit line rBL and the NMOS transistor N1. In the embodiment, an input terminal of the inverter INV1 is coupled to the read bit line rBL, and an output terminal of the inverter INV1 is coupled to a gate of the NMOS transistor N1.

Compared with the global read bit line rGBL, the read bit line rBL is a local bit line. In general, a plurality of local bit lines (e.g. rBL) may be provided and may all be in communication with a global bit line (e.g. rGBL). Furthermore, the local bit lines are further coupled to control circuits via the global bit line in a memory, and the control circuits of the memory can access the bit cell via the local bit line coupled to the accessed bit cell and the global bit line.

The keeper 130 includes the PMOS transistors P1 and P2. The PMOS transistor P1 is coupled between the power source VDD and the PMOS transistor P2, and has a gate for receiving a reference voltage Vref from the tracking circuit 140. The PMOS transistor P2 is a feedback PMOS transistor, and is coupled between the PMOS transistor P1 and the read bit line rBL. The PMOS transistor P2 has a gate coupled to the gate of the NMOS transistor N1 and the output terminal of the inverter INV1.

The tracking circuit 140 includes a pull-up device PU1. The pull-up device PU1 is coupled between the power source VDD and a reference bit line RefBL. In the embodiment, the pull-up device PU1 is a PMOS transistor, and a gate of the PMOS transistor is coupled to the ground GND. In some embodiments, the pull-up device PU1 can be a weak pull-up device having a process characterization similar to a PMOS transistor.

The tracking circuit 140 further includes a plurality of reference bit cells RBC1 through RBCn coupled to the reference bit line RefBL. The reference bit cells RBC1 through RBCn are disposed in an array. Each reference bit cell corresponds to the individual bit cell for the same read word line RWL and the same write word line WWL. Thus, the amount of reference bit cells RBC1-RBCn of the tracking circuit 140 is identical to the amount of bit cells BC1-BCn of the memory bank 110. For example, the reference bit cell RBC1 corresponding to the bit cell BC1 can be accessed by the read word line RWL1 and/or the write word line WWL1. Therefore, when the bit cell BC1 is selected (or addressed) by the read word line RWL1 and/or the write word line WWL1, the reference bit cell RBC1 is also selected (or addressed) by the read word line RWL1 and/or the write word line WWL1. Similarly, one reference bit cell is read at a time for the reference bit line RefBL.

Figure 2:
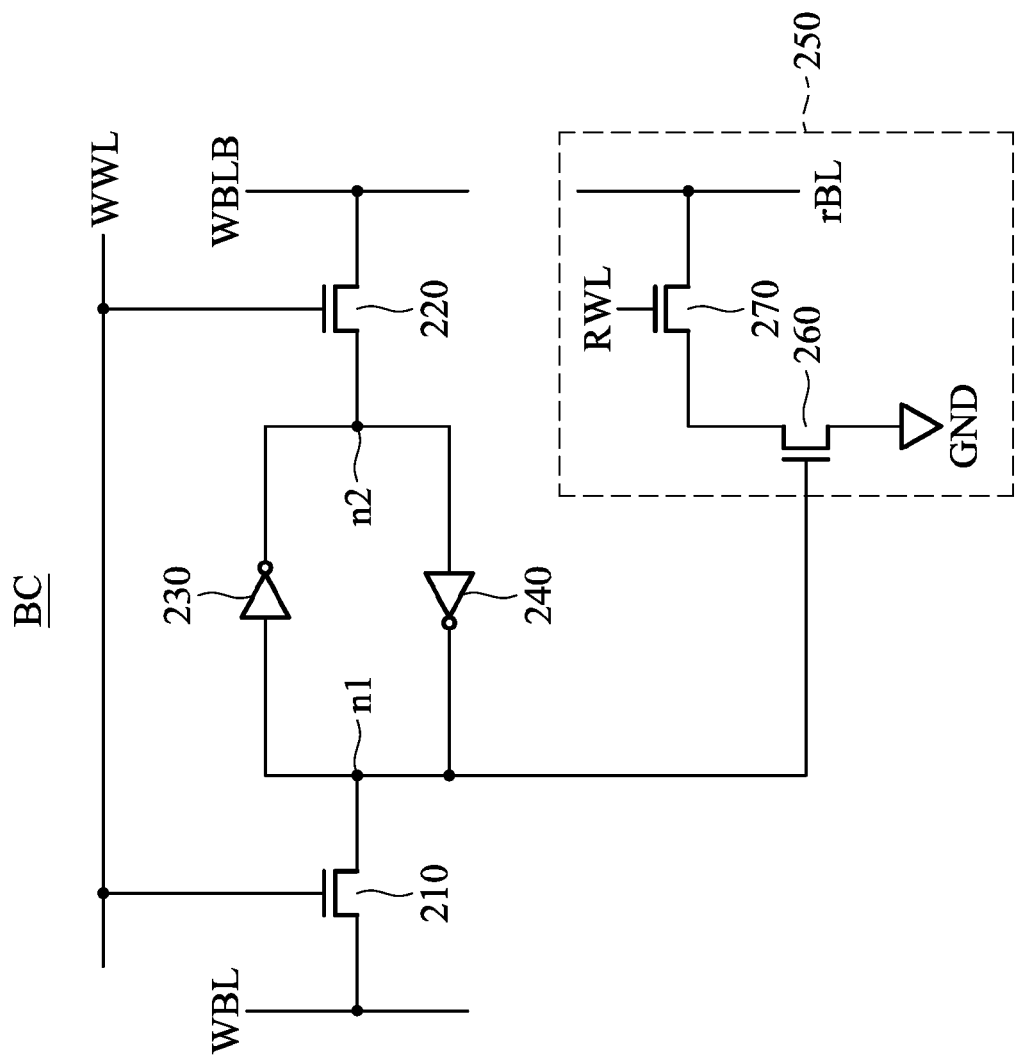
FIG. 2 shows a two-port SRAM bit cell, in accordance with some embodiments of the disclosure.

FIG. 2 shows a two-port SRAM bit cell BC, in accordance with some embodiments of the disclosure. The bit cell BC includes a pair of cross-coupled inverters 230 and 240, two pass gate transistors 210 and 220, and a read port 250. The inverters 230 and 240 are cross coupled between the nodes n1 and n2, and form a latch. The pass gate transistor 210 is coupled between a write bit line wBL and the node n1, and the pass gate transistor 220 is coupled between a complementary write bit line wBLB and the node n2, wherein the complementary write bit line wBLB is complementary to the write bit line wBL. The gates of the pass gate transistors 210 and 220 are coupled to the same write word line WWL. Furthermore, the pass gate transistors 210 and 220 are NMOS transistors. The read port 250 includes the transistor 260 and a pass gate transistor 270. The transistor 260 is an NMOS transistor, and is coupled between a ground GND and the pass gate transistor 270. The gate of the transistor 260 is coupled to the node n1. The pass gate transistor 270 is coupled between a read bit line rBL and the transistor 260. The gate of the pass gate transistor 270 is coupled to the read word line RWL.

Before accessing the bit cell BC, the corresponding read bit line is pre-charged in pre-charge period. When the bit cell BC is accessed for reading, the corresponding read word line RWL is activated and the data is read by detecting the logic level at the read bit line rBL coupled to the accessed bit cell BC. For example, when a low logic level (e.g. "0") is stored at the node n1 of the bit cell BC, the transistor 260 of the bit cell BCn is turned off, e.g. acting as an open circuit. As a result, a high logic level (e.g. "1") is detected in the read bit line rBL when the bit cell BC is accessed, i.e. a high logic level is read out. Conversely, if a high logic level is stored at the bit cell BC, the transistor 260 of the bit cell BC is turned on, and the read bit line rBL is coupled to the ground GND via the transistor 260 and the pass gate transistor 270 of the bit cell BC. Thus, a low logic level is detected in the read bit line rBL when the bit cell BCn is accessed for reading, i.e. a low logic level is read out. In the embodiment, the data in the read bit line rBL is processed to reflect the data stored at the accessed bit cell, i.e. the data in the read bit line rBL is complementary to the data stored in the accessed bit cell. In some embodiments, the data of the read bit line rBL is identical to the data stored in the accessed bit cell.

Referring to FIG. 1 and FIG. 2 together, in some embodiments, the bit cells BC1 through BCn and the reference bit cells RBC1 through RBCn have the same structure (e.g. the bit cell BC of FIG. 2). In some embodiments, compared with the bit cells BC1 through BCn, each of the reference bit cells RBC1 through RBCn stores a low logic level.

Assuming that the bit cell BCn that stores a high logic level is accessed by the read word line RWLn, the NMOS transistor 260 of the read port 250 in the bit cell BCn is turned on, and then the read bit line rBL is coupled to the ground GND (e.g. a low logic level is read out). Moreover, a read current is flowing through the read port of the bit cell BCn from the read bit line rBL to the ground GND. According to the low logic level of the read bit line rBL, the inverter INV1 outputs a high logic level to the NMOS transistor N1 and the PMOS transistor P2, and then the PMOS transistor P2 is turned off and the NMOS transistor N1 is turned on. Thus, the current I from the keeper 130 to the read bit line rBL is smaller than the read current of the bit cell BCn.

Assuming that the bit cell BC1 that stores a low logic level is accessed by the read word line RWL1, the NMOS transistor 260 of the read port 250 in the bit cell BC1 is turned off, and then the read bit line rBL is kept at a high logic level (e.g. a high logic level is read out). According to the high logic level of the read bit line rBL, the inverter INV1 outputs a low logic level to the NMOS transistor N1 and the PMOS transistor P2, and then the PMOS transistor P2 is turned on and the NMOS transistor N1 is turned off.

If the read word line RWL1 and the write word line WWL1 are both activated for the bit cell BC1, the gate voltage of the NMOS transistor 260 (i.e. the voltage at the node n1) will bounce up, thus the leakage current is worst for the read bit line rBL. The leakage current of the read bit line rBL is formed by a write disturbed current of the bit cell BC1 and the leakage currents of the rest bit cells (e.g. BC2 through BCn). Simultaneously, the reference bit cell RBC1 is also accessed by the read word line RWL1 and the write word line WWL1, and a leakage current of the reference read bit line RefBL is formed by a write disturbed current of the reference bit cell RBC1 and the leakage currents of the rest reference bit cells (e.g. RBC2 through RBCn). For the reference bit line RefBL, the reference voltage Vref is provided when the accessed reference bit cell drains a current from the pull-up device PU1, such as a leakage current. In some embodiments, the current further includes the leakage currents of the other reference bit cells. According to the leakage current of the reference read bit line RefBL, the voltage level of the reference voltage Vref begins to drop. Thus, in response to the decreased reference voltage Vref, the keeper 130 can provide more current to the read bit line rBL via the PMOS transistors P1 and P2. Thus, a current I from the keeper 130 to the read bit line rBL is larger than the sum of the write disturbed current of the bit cell BC1 and the leakage currents of the bit cells BC2 through BCn in the read bit line rBL. Furthermore, the voltage level of the read bit line rBL maintained/controlled by the keeper 130 is higher than a transition point of the inverter INV1, thereby avoiding an incorrect read operation caused by a larger leakage current.

If the memory 100 is operated in a skewed process corner "FS", the NMOS transistors of the read ports of the bit cells BC1 through BCn and the reference bit cells RBC1 through RBCn are at a high leakage corner, and the PMOS transistors of the keeper 130 and the tracking circuit 140 are at a slow corner. Thus, when one of the bit cells BC1 through BCn is accessed for reading, the reference voltage Vref is quickly dropped to low because of the high leakage current of the reference bit cells RBC1 through RBCn. Accordingly, a low voltage level of the reference voltage Vref can control the PMOS transistor P1 of the keeper 130 to provide more current I. Specifically, a stronger keeper 130 is capable of maintaining/controlling the read bit line rBL in a skewed process corner "FS".

If the memory 100 is operated in a skewed process corner "SF", the NMOS transistors of the read ports of the bit cells BC1 through BCn and the reference bit cells RBC1 through RBCn are at a slow corner (e.g. less leakage), and the PMOS transistors of the keeper 130 and the tracking circuit 140 are at a fast corner. Thus, when one of the bit cells BC1 through BCn is accessed for reading, the reference voltage Vref is slowly dropped because of the small leakage current of the reference bit cells RBC1 through RBCn. Accordingly, a high voltage level of the reference voltage Vref can control the PMOS transistor P1 of the keeper 130 to provide less current I. In some embodiments, the voltage level of the reference voltage Vref is close to the voltage level of the power source VDD, and the PMOS transistor P1 will be turned off. Specifically, a weak keeper 130 is capable of maintaining/controlling the read bit line rBL in a skewed process corner "SF".

In the tracking circuit 140, by adjusting the size of the PMOS transistor in the pull-up device PU1, the voltage level of the reference voltage Vref can be controlled. For example, if the leakage current of each bit cell is large, the voltage level of the reference voltage Vref will be lower when the PMOS transistor of the pull-up device PU1 has a smaller size. Moreover, if the read current of each bit cell is low, the voltage level of the reference voltage Vref will be higher when the PMOS transistor in the pull-up device PU1 has a larger size.

In a specific keeper, a long channel PMOS transistor and a feedback PMOS transistor are connected in series between a power source (e.g. VDD) and a read bit line, and a gate of the long channel PMOS transistor is coupled to the ground GND. In order to operate at all corners of PVT variations, the specific keeper can operate with limited size. Furthermore, a current through to the read port of each bit cell coupled to the specific keeper also needs to be considered when the NMOS transistors of the read port are turned on/off.

According to the reference voltage Vref from the tracking circuit 140 that is automatically varied for different PVT variations, the keeper 130 coupled to the read bit line rBL can operate at all skewed corners. Furthermore, compared with the specific keeper, the sizes of the PMOS transistors P1 and P2 of the keeper 130 are independent of the leakage currents and the read currents of the bit cells BC1 through BCn, thereby decreasing a layout area of the keeper 130.

Figure 3:
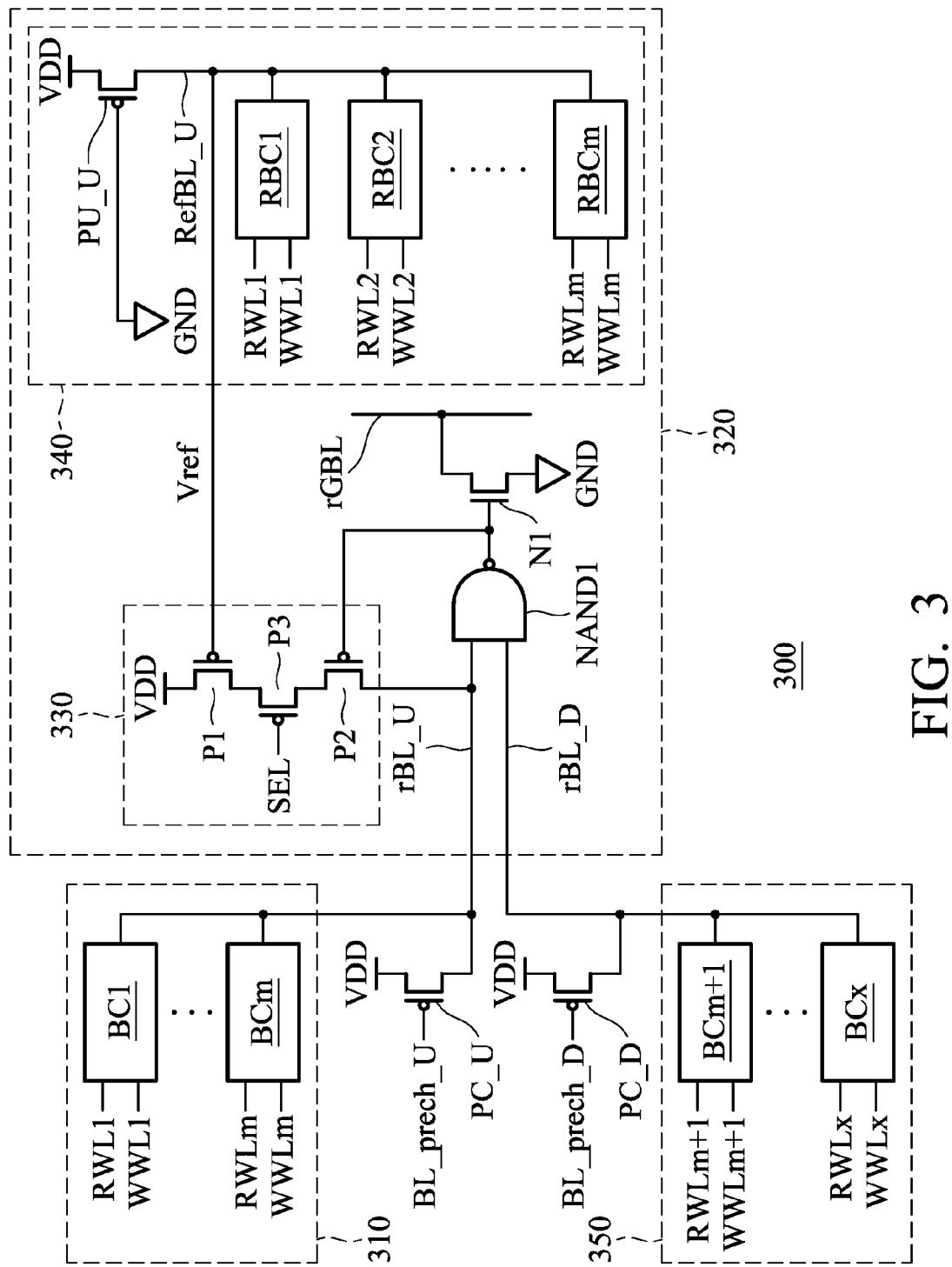
FIG. 3 shows a memory, in accordance with some embodiments of the disclosure.

FIG. 3 shows a memory 300, in accordance with some embodiments of the disclosure. The memory 300 includes a first memory bank 310, an interface circuit 320, two pre-charge transistors PC_U and PC_D, and a second memory bank 350. The memory 300 can be an independent device or be implemented in an integrated circuit (e.g. System on Chip (SOC)).

In some embodiments, the memory 300 is a multi-port SRAM, such as a 2 ports (2P) SRAM. In some embodiments, the first memory bank 310 is an up bank and the second memory bank 350 is a down bank for a global read line rGBL.

The first memory bank 310 includes a plurality of bit cells BC1 through BCm, and the bit cells BC1 through BCm are disposed in a memory array. In the first memory bank 310, each bit cell is coupled to the write bit line (not shown) and a first read bit line rBL_U. Furthermore, each bit cell is capable of storing one-bit data, and each bit cell can be accessed by an individual read word line RWL and an individual write word line WWL. For example, the bit cell BC1 can be accessed by a read word line RWL1 and/or a write word line WWL1. When the bit cell BC1 is selected (or addressed) by the read word line RWL1, data stored in the bit cell BC1 is provided to the first read bit line rBL_U.

The second memory bank 350 includes a plurality of bit cells BCm+1 through BCx, and the bit cells BCm+1 through BCx are disposed in a memory array. In the second memory bank 350, each bit cell is coupled to the write bit line (not shown) and a second read bit line rBL_D. Furthermore, each bit cell is capable of storing one-bit data, and each bit cell can be accessed by an individual read word line RWL and an individual write word line WWL. For example, the bit cell BCx can be accessed by a read word line RWLx and/or a write word line WWLx. When the bit cell BCx is selected (or addressed) by the read word line RWLx, data stored in the bit cell BCx is provided to the second read bit line rBL_D.

In the first memory bank 310 and the second memory bank 350, each of the bit cells BC1 through BCx is coupled to the individual read word line and the individual write word line. Furthermore, one bit cell is read at a time for the first read bit line rBL_U and the second read bit line rBL_D. In some embodiments, the read word line RWL and the write word line WWL coupled to the same bit cell can be integrated into a single word line WL for a single-port SRAM.

The pre-charge transistor PC_U is coupled between the power source VDD and the first read bit line rBL_U. A gate of the pre-charge transistor PC_U is capable of receiving a pre-charge enable signal BL_prech_U to turn on the pre-charge transistor PC_U, so as to connect the power source VDD to the first read bit line rBL_U during a pre-charge period. Furthermore, the pre-charge transistor PC_D is coupled between the power source VDD and the second read bit line rBL_D. A gate of the pre-charge transistor PC_D is capable of receiving a pre-charge enable signal BL_prech_D to turn on the pre-charge transistor PC_D, so as to connect the power source VDD to the second read bit line rBL_D during the pre-charge period. It should be noted that the number, type, and disposition of the pre-charge transistors PC_U and PC_D are merely exemplary. One skilled in the art can modify them to achieve a desired memory.

It should be noted that the re-charge transistor PC_D is turned on by the pre-charge enable signal BL_prech_D when the first memory bank 310 is accessed for reading. Conversely, the re-charge transistor PC_U is turned on by the pre-charge enable signal BL_prech_U when the second memory bank 350 is accessed for reading.

The interface circuit 320 includes a keeper 330, a tracking circuit 340, an NAND gate NAND1, and an NMOS transistor N1. The NMOS transistor N1 is coupled between a global read bit line rGBL and a ground GND. The gate of the NMOS transistor N1 is coupled to an output terminal of the NAND gate NAND1. A first input terminal of the NAND gate NAND1 is coupled to the first read bit line rBL_U, and a second input terminal of the NAND gate NAND1 is coupled to the second read bit line rBL_D. Compared with the global read bit line rGBL, the first read bit line rBL_U and the second read bit line rBL_D are the local bit lines.

The keeper 330 includes the PMOS transistors P1 through P3. The PMOS transistor P1 is coupled between the power source VDD and the PMOS transistor P3, and has a gate for receiving a reference voltage Vref from the tracking circuit 340. The PMOS transistor P2 is a feedback PMOS transistor, and is coupled between the PMOS transistor P3 and the first read bit line rBL_U, and has a gate coupled to the gate of the NMOS transistor N1 and the output terminal of the NAND gate NAND1. The PMOS transistor P3 is coupled between the PMOS transistors P1 and P2, and has a gate for receiving a control signal SEL. When one of the bit cells BC1 through BCm is accessed for reading in the first memory bank 310, the PMOS transistor P3 is turned on by the control signal SEL. Thus, the voltage level of the read bit line rBL_U is maintained/controlled by the keeper 330. In some embodiments, the control signal SEL is equal to the pre-charge enable signal BL_prech_D, e.g. SEL=BL_prech_D. For example, when the first memory bank 310 is accessed, the PMOS transistor P3 is turned on by the control signal SEL, and the pre-charge transistor PC_D is also turned on by the pre-charge enable signal BL_prech_D, e.g. SEL=BL_prech_D="0".

The tracking circuit 340 includes a plurality of reference bit cells RBC1 through RBCm and a pull-up transistor PU_U. The pull-up transistor PU_U is coupled between the power source VDD and a reference bit line RefBL_U, and has a gate coupled to the ground GND. The reference bit cells RBC1 through RBCm are disposed in an array, and each reference bit cell is coupled to the reference bit line RefBL_U. As described above, each reference bit cell in the tracking circuit 340 corresponds to the individual bit cell of the first memory bank 310 for the same read word line RWL and the same write word line WWL. In some embodiments, compared with the bit cells BC1 through BCm of the first memory bank 310, each of the reference bit cells RBC1 through RBCm stores a low logic level.

The amount of reference bit cells RBC1 through RBCm of the tracking circuit 340 is identical to the amount of bit cells BC1 through BCm of the first memory bank 310. In some embodiments, the amount of bit cells BC1 through BCm of the first memory bank 310 is 32 or 64. In some embodiments, the amount of bit cells BC1 through BCm of the first memory bank 310 is larger than the amount of bit cells BCm+1 through BCx of the second memory bank 350. In some embodiments, the bit cells BC1 through BCm of the first memory bank 310, and the bit cells BCm+1 through BCx of the second memory bank 350, and the reference bit cells RBC1 through RBCm of the tracking circuit 340 have the same structure (e.g. the bit cell BC of FIG. 2).

According to the reference voltage Vref from the tracking circuit 340 that is automatically varied for different PVT variations, the keeper 330 coupled to the read bit line rBL_U can operate at all skewed corners. Furthermore, compared with the specific keepers, the sizes of the PMOS transistors P1 through P3 of the keeper 330 are independent of the leakage currents and the read currents of the bit cells BC1 through BCm of the first memory bank 310, thereby decreasing a layout area of the keeper 330.

Figure 4:
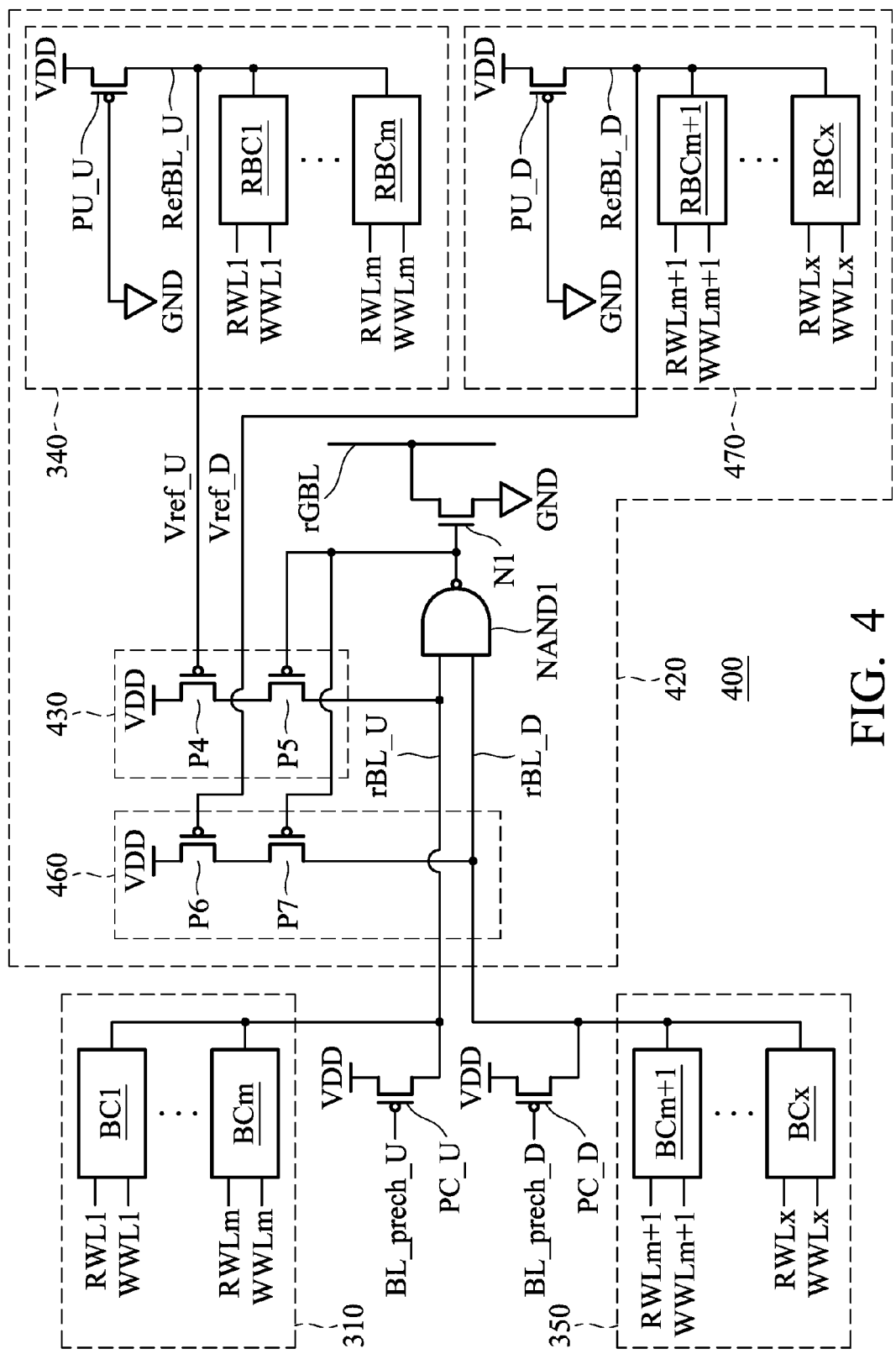
FIG. 4 shows a memory, in accordance with some embodiments of the disclosure.

FIG. 4 shows a memory 400, in accordance with some embodiments of the disclosure. The memory 400 includes a first memory bank 310, an interface circuit 420, the pre-charge transistors PC_U and PC_D, and a second memory bank 350. The memory 400 can be an independent device or be implemented in an integrated circuit (e.g. System on Chip (SOC)).

As described above, in the first memory bank 310 and the second memory bank 350 of the memory 400, each of the bit cells BC1 through BCx has the individual read word line and the individual write word line. Furthermore, one bit cell is read at a time for the first read bit line rBL_U and the second read bit line rBL_D. In some embodiments, the read word line RWL and the write word line WWL coupled to the same bit cell can be integrated into a single word line WL for a single-port SRAM.

Compared with the interface circuit 320 of the memory 300, the interface circuit 420 includes two keepers 130 and 460, and two tracking circuits 340 and 470. The keeper 430 is coupled to the first read bit line rBL_U coupled to the first memory bank 310, and is capable of maintaining/controlling a voltage level of the first read bit line rBL_U according the reference voltage Vref_U from the tracking circuit 340. Furthermore, the keeper 460 is coupled to the second read bit line rBL_D coupled to the second memory bank 350, and is capable of maintaining/controlling a voltage level of the second read bit line rBL_D according the reference voltage Vref_D from the tracking circuit 470.

The keeper 430 includes the PMOS transistors P4 and P5. The PMOS transistor P4 is coupled between the power source VDD and the PMOS transistor P5, and has a gate for receiving a reference voltage Vref_U from the tracking circuit 340. The PMOS transistor P5 is a feedback PMOS transistor, and is coupled between the PMOS transistor P4 and the first read bit line rBL_U, and has a gate coupled to the gate of the NMOS transistor N1 and the output terminal of the NAND gate NAND1. Similarly, the keeper 460 includes the PMOS transistors P6 and P7. The PMOS transistor P6 is coupled between the power source VDD and the PMOS transistor P7, and has a gate for receiving a reference voltage Vref_D from the tracking circuit 470. The PMOS transistor P7 is a feedback PMOS transistor, and is coupled between the PMOS transistor P6 and the second read bit line rBL_D, and has a gate coupled to the gate of the NMOS transistor N1 and the output terminal of the NAND gate NAND1.

As described above, the reference bit cells RBC1 through RBCm of the tracking circuit 340 are coupled to the reference bit line RefBL_U. Furthermore, each reference bit cell in the tracking circuit 340 corresponds to the individual bit cell in the first memory bank 310 for the same read word line RWL and the same write word line WWL. In some embodiments, each of the reference bit cells RBC1 through RBCm stores a low logic level.

The tracking circuit 470 includes a plurality of reference bit cells RBCm+1 through RBCx and a pull-up transistor PU_D. The pull-up transistor PU_D is coupled between the power source VDD and a reference bit line RefBL_D, and has a gate coupled to the ground GND. The reference bit cells RBCm+1 through RBCx are disposed in an array, and each reference bit cell is coupled to the reference bit line RefBL_D. Moreover, each reference bit cell in the tracking circuit 470 corresponds to the individual bit cell in the second memory bank 350 for the same read word line RWL and the same write word line WWL. In some embodiments, compared with the bit cells BCm+1 through BCx of the second memory bank 350, each of the reference bit cells RBCm+1 through RBCx stores a low logic level.

The amount of reference bit cells RBC1 through RBCm of the tracking circuit 340 is identical to the amount of bit cells BC1 through BCm of the first memory bank 310. Furthermore, the amount of reference bit cells RBCm+1 through RBCx of the tracking circuit 470 is identical to the amount of bit cells BCm+1 through BCx of the second memory bank 350.

In some embodiments, the amount of bit cells BC1 through BCm of the first memory bank 310 is 32 or 64. In some embodiments, the amount of bit cells BC1 through BCm of the first memory bank 310 is larger than or equal to the amount of bit cells BCm+1 through BCx of the second memory bank 350. In some embodiments, the bit cells BC1 through BCm of the first memory bank 310, and the bit cells BCm+1 through BCx of the second memory bank 350, the reference bit cells RBC1 through RBCm of the tracking circuit 340, and the reference bit cells RBCm+1 through RBCx of the tracking circuit 470 have the same structure (e.g. the bit cell BC of FIG. 2).

According to the reference voltage Vref_U from the tracking circuit 340 that is automatically varied for different PVT variations, the keeper 430 coupled to the first read bit line rBL_U can operate at all skewed corners. Simultaneously, according to the reference voltage Vref_D from the tracking circuit 470 that is automatically varied for different PVT variations, the keeper 460 coupled to the second read bit line rBL_D can operate at all skewed corners.

Embodiments for adjusting current strength of keeper for a memory are provided. A tracking circuit of the memory is capable of providing a reference voltage to control the current of the keeper for different PVT variations. For example, if the memory is operated in a skewed process corner "SF", the read port of the bit cells and the reference bit cells are at a slow corner (e.g. less leakage current). Thus, the reference voltage from the tracking circuit is capable of control the keeper to provide a weak current to the corresponding read bit line when one bit cell coupled to the corresponding read bit line is accessed for reading. If the memory is operated in a skewed process corner "FS", the read port of the bit cells and the reference bit cells are at a fast corner (e.g. larger leakage current). Thus, the reference voltage from the tracking circuit is capable of control the keeper to provide a stronger current to the corresponding read bit line when one bit cell coupled to the corresponding read bit line is accessed for reading. Specifically, the tracking circuit has good tracking with the leakage current of the read port and the process corner of the keeper by using the reference bit cells and the pull-up device. Furthermore, the PMOS transistors of the keeper have the sizes independent of leakage currents and read current of the read ports coupled to the corresponding read bit line, thereby decreasing layout area of the keeper.

In some embodiments, an interface circuit for a bit line of a memory is provided. The interface circuit includes a NMOS transistor coupled between the bit line and a ground, a logic gate coupled between a gate of the NMOS transistor and a read bit line, a keeper coupled to the read bit line, and a tracking circuit. The keeper maintains/controls a voltage level of the read bit line according to a reference voltage. The tracking circuit provides the reference voltage, and includes a plurality of reference bit cells coupled to a reference bit line, and a pull-up device coupled to the reference bit line. Each of the reference bit cells is coupled to a read word line. When a bit cell coupled to the read bit line is accessed by a specific read word line, the reference bit cell coupled to the specific read word line is accessed and drains a current from the pull-up device, and the tracking circuit provides the reference voltage according to the current. The current includes leakage currents of the reference bit cells.

In some embodiments, a memory is provided. The memory includes a plurality of first bit cells coupled to a first read bit line, a keeper coupled to the first bit line, and a tracking circuit. Each of the first bit cells is coupled to a read word line. The keeper maintains/controls a voltage level of the first read bit line according to a reference voltage. The tracking circuit includes a plurality of reference bit cells coupled to a reference bit line, and a pull-up device coupled to the reference bit line. Each of the reference bit cells corresponds to the individual first bit cell, wherein each of the reference bit cells is coupled to the read word line corresponding to the individual first bit cell. When a specific first bit cell of the first bit cells is accessed by the corresponding read word line, the reference bit cell coupled to the specific read word line is accessed and drains a current from the pull-up device, and the tracking circuit provides the reference voltage according to the current. The current includes leakage currents of the reference bit cells.

In some embodiments, another memory is provided. The memory includes a NMOS transistor coupled between a global bit line and a ground, a NAND gate, a plurality of bit cells divided into a first group coupled to the first read bit line and a second group coupled to the second read bit line, a first keeper coupled to the first bit line, and a first tracking circuit. The NAND gate has a first input terminal coupled to a first read bit line, a second input terminal coupled to a second read bit line, and an output terminal coupled to the gate of the NMOS transistor. Each of the bit cells is coupled to a read word line. The first keeper maintains/controls a voltage level of the first read bit line according to a first reference voltage. The first tracking circuit includes a plurality of first reference bit cells coupled to a first reference bit line, and a first pull-up device coupled to the first reference bit line. Each of the first reference bit cells corresponds to the individual bit cell of the first group, wherein each of the first reference bit cells is coupled to the read word line corresponding to the individual bit cell of the first group. When a specific bit cell of the first group is accessed by the corresponding read word line, the first reference bit cell coupled to the specific read word line is accessed and drains a first current from the first pull-up device, and the first tracking circuit provides the first reference voltage according to the first current. The first current includes leakage currents of the first reference bit cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interface circuit, comprising:
an NMOS transistor coupled between a first bit line and a ground;
a logic gate coupled between a gate of the NMOS transistor and a second bit line;
a keeper coupled to the second bit line, controlling a voltage level of the second bit line according to a reference voltage; and
a tracking circuit, providing the reference voltage and comprising:
a plurality of reference bit cells coupled to a reference bit line, wherein each of the reference bit cells is coupled to a read word line; and
a pull-up device coupled to the reference bit line,
wherein when a bit cell coupled to the second bit line is accessed by a specific read word line, the reference bit cell coupled to the specific read word line is accessed and drains a current from the pull-up device, and the tracking circuit provides the reference voltage according to the current.

2. The interface circuit as claimed in claim 1, wherein the keeper comprises:
a first PMOS transistor coupled to a power source, having a gate coupled to the reference bit line of the tracking circuit for receiving the reference voltage; and
a second PMOS transistor coupled between the first PMOS transistor and the second bit line, having a gate coupled to the gate of the NMOS transistor.

3. The interface circuit as claimed in claim 1, wherein the pull-up device comprises:
an PMOS transistor coupled between a power source and the reference bit line, having a gate coupled to the ground.

4. The interface circuit as claimed in claim 1, wherein the logic gate is an inverter, and the inverter has an input terminal coupled to the second bit line and an output terminal coupled to the gate of the NMOS transistor.

5. The interface circuit as claimed in claim 1, wherein the logic gate is a NAND gate, and the NAND gate has a first input terminal coupled to the second bit line, a second input terminal coupled to another bit line, and an output terminal coupled to the gate of the NMOS transistor.

6. The interface circuit as claimed in claim 5, wherein the keeper comprises:
a first PMOS transistor coupled to a power source, having a gate coupled to the reference bit line of the tracking circuit for receiving the reference voltage;
a second PMOS transistor coupled between the first PMOS transistor and the second bit line, having a gate coupled to the gate of the NMOS transistor; and
a third PMOS transistor coupled between the first and second PMOS transistors,
wherein the third PMOS transistor is turned on when the bit cell coupled to the second bit line is accessed, and the third PMOS transistor is turned off when a bit cell coupled to another bit line is accessed.

7. A memory, comprising:
a plurality of first bit cells coupled to a first read bit line, wherein each of the first bit cells is coupled to a read word line;
a keeper coupled to the first read bit line, controlling a voltage level of the first read bit line according to a reference voltage; and
a tracking circuit, comprising:
a plurality of reference bit cells coupled to a reference bit line, each corresponding to the individual first bit cell and storing a low logic level, wherein each of the reference bit cells is coupled to the read word line corresponding to the individual first bit cell; and
a pull-up device coupled to the reference bit line,
wherein when a specific first bit cell of the first bit cells is accessed by a specific read word line, the reference bit cell coupled to the specific read word line is accessed and drains a current from the pull-up device, and the tracking circuit provides the reference voltage according to the current.

8. The memory as claimed in claim 7, further comprising:
a first pre-charge transistor coupled between a power source and the first read bit line, pre-charging the first read bit line to a voltage level of the power source.

9. The memory as claimed in claim 7, wherein the pull-up device comprises:
an PMOS transistor coupled between a power source and the reference bit line, having a gate coupled to the ground.

10. The memory as claimed in claim 7, further comprising:
a NMOS transistor coupled between a global bit line and a ground; and
a logic gate coupled between a gate of the NMOS transistor and the first read bit line.

11. The memory as claimed in claim 10, wherein the keeper comprises:
a first PMOS transistor coupled to a power source, having a gate coupled to the reference bit line of the tracking circuit for receiving the reference voltage; and
a second PMOS transistor coupled between the first PMOS transistor and the first read bit line, having a gate coupled to the gate of the NMOS transistor.

12. The memory as claimed in claim 10, wherein the logic gate is an inverter, and the inverter has an input terminal coupled to the first read bit line and an output terminal coupled to the gate of the NMOS transistor.

13. The memory as claimed in claim 7, further comprising:
an NMOS transistor coupled between a global bit line and a ground;
a logic gate coupled between a gate of the NMOS transistor and the first read bit line; and
a plurality of second bit cells coupled to a second read bit line, wherein each of the second bit cells is coupled to the individual read word line.

14. The memory as claimed in claim 13, further comprising:
a first pre-charge transistor coupled between a power source and the first read bit line, pre-charging the first read bit line to a voltage level of the power source; and
a second pre-charge transistor coupled between the power source and the second read bit line, pre-charging the second read bit line to the voltage level of the power source.

15. The memory as claimed in claim 13, wherein the logic gate is a NAND gate, and the NAND gate has a first input terminal coupled to the first read bit line, a second input terminal coupled to the second read bit line, and an output terminal coupled to the gate of the NMOS transistor.

16. The memory as claimed in claim 13, wherein the keeper comprises:
- a first PMOS transistor coupled to a power source, having a gate coupled to the reference bit line of the tracking circuit for receiving the reference voltage;
- a second PMOS transistor coupled between the first PMOS transistor and the first read bit line, having a gate coupled to gate of the NMOS transistor; and
- a third PMOS transistor coupled between the first and second PMOS transistors,
- wherein the third PMOS transistor is turned on one of the first bit cells coupled to the first read bit line is accessed, and the third PMOS transistor is turned off when one of the second bit cells coupled to the second read bit line is accessed.

17. A memory, comprising:
- a NMOS transistor coupled between a global bit line and a ground;
- a NAND gate, having a first input terminal coupled to a first read bit line, a second input terminal coupled to a second read bit line, and an output terminal coupled to the gate of the NMOS transistor;
- a plurality of bit cells divided into a first group coupled to the first read bit line and a second group coupled to the second read bit line, wherein each of the bit cells is coupled to a read word line;
- a first keeper coupled to the first read bit line, controlling a voltage level of the first read bit line according to a first reference voltage; and
- a first tracking circuit, comprising:
  - a plurality of first reference bit cells coupled to a first reference bit line, each corresponding to the individual bit cell of the first group and storing a low logic level, wherein each of the first reference bit cells is coupled to the read word line corresponding to the individual bit cell of the first group; and
  - a first pull-up device coupled to the first reference bit line,
- wherein when a specific bit cell of the first group is accessed by a specific read word line, the first reference bit cell coupled to the specific read word line is accessed and drains a first current from the first pull-up device, and the first tracking circuit provides the first reference voltage according to the first current.

18. The memory as claimed in claim 17, further comprising:
- a first pre-charge transistor coupled between a power source and the first read bit line, pre-charging the first read bit line to a voltage level of the power source; and
- a second pre-charge transistor coupled between the power source and the second read bit line, pre-charging the second read bit line to the voltage level of the power source.

19. The memory as claimed in claim 17, further comprising:
- a second keeper coupled to the second bit line, maintaining a voltage level of the second read bit line according to a second reference voltage; and
- a second tracking circuit, comprising:
  - a plurality of second reference bit cells coupled to a second reference bit line, each corresponding to the individual bit cell of the second group, wherein each of the second reference bit cells is coupled to the read word line corresponding to the individual bit cell of the second group; and
  - a second pull-up device coupled to the second reference bit line,
- wherein when a specific bit cell of the second group is accessed by the corresponding read word line, the second reference bit cell coupled to the corresponding read word line is accessed and drains a second current from the second pull-up device, and the second tracking circuit provides the second reference voltage according to the second current.

20. The memory as claimed in claim 19, wherein the first keeper comprises:
- a first PMOS transistor coupled to a power source, having a gate coupled to the first reference bit line of the first tracking circuit for receiving the first reference voltage; and
- a second PMOS transistor coupled between the first PMOS transistor and the first read bit line, having a gate coupled to gate of the NMOS transistor, wherein the second keeper comprises:
- a third PMOS transistor coupled to the power source, having a gate coupled to the second reference bit line of the second tracking circuit for receiving the second reference voltage; and
- a fourth PMOS transistor coupled between the third PMOS transistor and the second read bit line, having a gate coupled to gate of the NMOS transistor.

* * * * *